(12) United States Patent
Murphy (10) Patent No.: US 7,732,829 B2
(45) Date of Patent: Jun. 8, 2010

(54) OPTOELECTRONIC DEVICE SUBMOUNT (75) Inventor: Thomas Murphy, Berlin (DE)

(73) Assignee: Hymite A/S, Alleroed (DK)

( * ) Notice: Subject to any disclaimer, the term of this patent is extended or adjusted under 35 U.S.C. 154(b) by 125 days.

(21) Appl. No.: 12/026,113

(22) Filed: Feb. 5, 2008

(65) Prior Publication Data
US 2009/0194777 A1 Aug. 6, 2009

(51) Int. Cl.
*H01L 21/00* (2006.01)
*H01L 33/38* (2010.01)
*H01L 33/40* (2010.01)
*H01L 33/48* (2010.01)

(52) U.S. Cl. .............................. 257/99; 438/25; 438/26; 438/28

(58) Field of Classification Search .................. 438/25, 438/26, 28; 257/99
See application file for complete search history.

(56) References Cited

U.S. PATENT DOCUMENTS

| | | | |
|---|---|---|---|
| 3,982,268 A * | 9/1976 | Anthony et al. ................ 257/45 |
| 4,843,280 A * | 6/1989 | Lumbard et al. ............ 313/500 |
| 6,486,499 B1 * | 11/2002 | Krames et al. ................. 257/81 |
| 6,642,550 B1 * | 11/2003 | Whitworth et al. ............ 257/99 |
| 7,189,962 B2 * | 3/2007 | Tomioka ..................... 250/239 |
| 7,253,388 B2 | 8/2007 | Kuhmann et al. |
| 2005/0051789 A1 | 3/2005 | Negley |
| 2006/0006404 A1 | 1/2006 | Ibbetson et al. |
| 2006/0054910 A1 | 3/2006 | Takemori et al. |
| 2007/0170450 A1 | 7/2007 | Murphy |

FOREIGN PATENT DOCUMENTS

| JP | 11-026647 | 1/1999 |
|---|---|---|
| JP | 2003-046256 | 2/2003 |

* cited by examiner

*Primary Examiner*—Evan Pert
(74) *Attorney, Agent, or Firm*—Fish & Richardson P.C.

(57) ABSTRACT

A submount for an optoelectronic device includes a substrate, a first top pad on a top surface of the substrate, a first bottom pad on a bottom surface of the substrate and a first wrap-around contact in a sidewall recess of the substrate, in which the first wrap-around contact is coupled electrically to the first top pad and to the first bottom pad. Alternatively, or in addition, the submount includes a device mounting pad on the top surface of the substrate, a wire-bond pad on the top surface of the substrate, a contact pad on the bottom surface of the substrate and a feedthrough contact which extends through the substrate and electrically couples the wire-bond pad to the contact pad.

37 Claims, 9 Drawing Sheets

OPTOELECTRONIC DEVICE SUBMOUNT

BACKGROUND

This disclosure relates to optoelectronic device submounts. Optoelectronic devices, such as light emitting diodes (LEDs), are used for a variety of applications. For example, LEDs are commonly used in consumer electronic devices such as flash elements in mobile camera phones. In some cases, LEDs can be used as backlighting in laptop displays. In other examples, LEDs are used in automobiles as brake lights, head lights or for cabin lighting.

In conventional LED packages, a LED chip is placed on a submount that enables electrical connection to the LED chip. To accommodate different types of LED chips, various submounts have been produced with a range of sizes, geometries, and electrical connections. However, there is no single submount design that can accommodate the different LED chip designs. In addition, existing LED submounts can lead to increases in package size and cost. Furthermore, many LED submounts are not compatible with surface mount devices (SMDs). In some cases, it is not possible to incorporate circuitry into the LED chip because solder reflow techniques can lead to circuit damage.

SUMMARY

The details of one or more embodiments of the invention are set forth in the description below and the accompanying drawings. Other features will be apparent from the description, the drawings and the claims.

In one aspect, a submount for an optoelectronic device includes a substrate, a first top pad on a top surface of the substrate, a first bottom pad on a bottom surface of the substrate and a first wrap-around contact in a sidewall recess of the substrate, in which the first wrap-around contact is coupled electrically to the first top pad and to the first bottom pad.

In some implementations, the submount further includes a second top pad on the top surface of the substrate, a second bottom pad on the bottom surface of the substrate and a second wrap-around contact in a second sidewall recess of the substrate. The second wrap-around contact is coupled electrically to the second top pad and to the second bottom pad. In some cases, the first top pad is a device mounting pad and the second top pad is a wire-bond pad. In some implementations, the first bottom pad is a SMD contact pad. In some cases, the second bottom pad is a thermally conductive contact pad.

Each of the first sidewall recess and the second sidewall recess can include an inclined sidewall. The first wrap-around contact can be on the inclined sidewall of the first recess and the second wrap-around contact can be on the inclined sidewall of the second recess.

In another aspect, a submount for an optoelectronic device includes a substrate, a device mounting pad on a top surface of the substrate, a wire-bond pad on the top surface of the substrate, a contact pad on the bottom surface of the substrate and a feedthrough contact extending through the substrate and electrically coupling the wire-bond pad to the contact pad.

In some implementations, the submount includes a thermally conducting pad on the bottom surface of the substrate. In some cases, the feedthrough contact is on a sidewall of a feedthrough opening such that an unobstructed passageway extends from the top surface through the substrate to the bottom surface.

In certain implementations, the submount also includes more than one wire-bond pad on the top surface of the substrate, more than one contact pad on the bottom surface of the substrate and more than one feedthrough contact extending through the substrate. Each feedthrough contact electrically couples one of the wire-bond pads to one of the contact pads.

In some implementations, the submount also includes a solder dam on the bottom surface of the substrate, in which the solder dam couples the feedthrough contact to the contact pad.

In some cases, the contact pad of the submount is a SMD pad.

In certain implementations, the submount includes a planar metal layer on the substrate top surface, in which the planar metal layer electrically couples the device mounting pad to the wire-bond pad.

The submount also can include an optoelectronic device mounted to the device mounting pad. The optoelectronic device can be a LED. A wire-bond can electrically connect the optoelectronic device to the wire-bond pad.

In some implementations, the submount also includes passive or active circuit components within the substrate. The passive or active circuit components can include electrostatic discharge protection circuitry. The electrostatic discharge protection circuitry can be formed within a substrate of the submount and electrically coupled to the optoelectronic device.

In certain cases, the submount includes a cover for the optoelectronic device. The cover can be attached on the substrate to seal the optoelectronic component. The cover can be a lens. The lens can include a polymer.

In another aspect, fabricating an optoelectronic submount includes forming more than one cavity in a substrate, depositing a metal layer on a top and bottom surface of the substrate and on a sidewall of each cavity, patterning the metal layer to form a landing pad and wire-bond pad on the substrate top surface and a contact pad and a SMD pad on the substrate bottom surface and dicing the substrate into a submount. Each opening in a cavity extends from a bottom surface of the substrate to a top surface of the substrate. The metal layer on a first cavity sidewall electrically couples the landing pad to the contact pad. The metal layer on a second cavity sidewall electrically couples the wire-bond pad to the SMD pad.

In some cases, the cavity openings are sealed with metal.

DETAILED DESCRIPTION

FIGS. 1A, 1B, 2, 3A and 3B show, according to a first embodiment, a submount 1 for an optoelectronic device. The top surface 5 is the submount assembly side on which one or more optoelectronic components are assembled and mounted. The bottom surface 19 of the submount 1 is the contact side to which one or more external electrical connections can be made. The contact side 19, in some implementations, also serves to provide a thermal connection to the external environment or to a heat sink (not shown) in order to reduce device temperature. The top surface 5 of submount 1 is substantially parallel to and opposite from the bottom surface 19. Both the top and bottom surfaces 5, 19 intersect with four vertical sidewalls 4 in a single integral device.

Figure 1A:
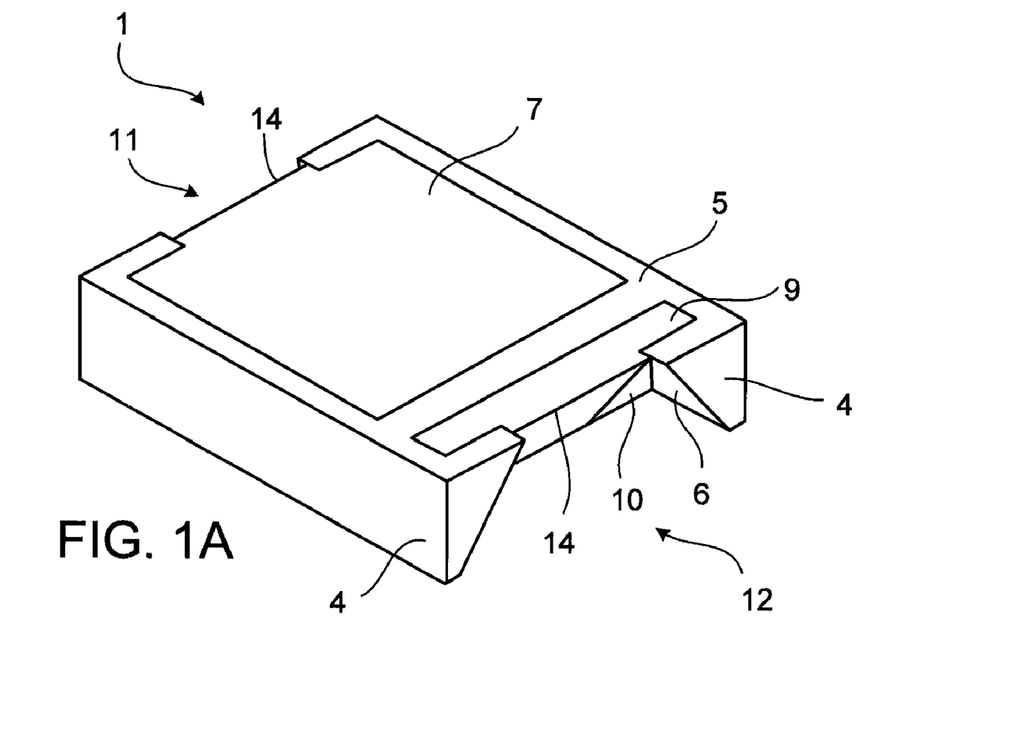
FIG. 1A illustrates an example of a submount for an optoelectronic device.
Figure 3A:
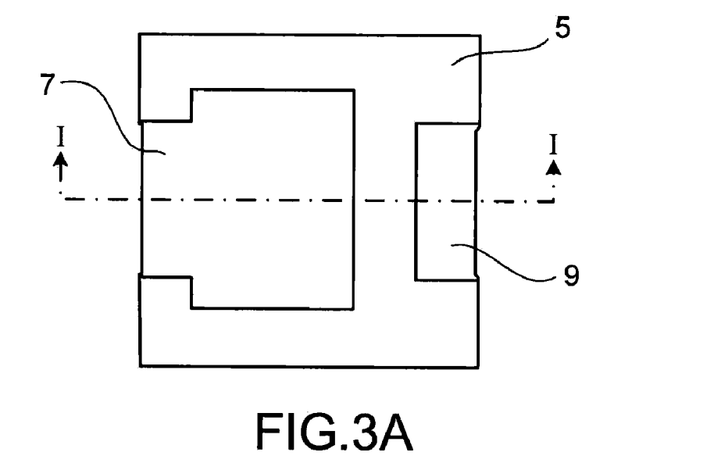
FIG. 3A is a top view of the submount of FIG. 1A.

As illustrated in FIGS. 1A and 3A, the top surface 5 includes planar landing pad 7. The landing pad 7 establishes an area on which an optoelectronic component can be mounted. Examples of optoelectronic components include, but are not limited to, LEDs, laser diodes and photodiodes. The generic rectangular landing pad 7 design is suitable for mounting most conventional LED chips. However, other pad configurations also can be used to accommodate optoelectronic devices having different structures and profiles. In some implementations, the landing pad 7 is configured so as to align with electrical contact pads of the optoelectronic device.

A planar wire-bond pad 9 also is formed on the assembly side 5 of the submount 1 and is electrically and thermally isolated from the landing pad 7. The wire-bond pad 9 serves as a surface on which wire-bond connections, such as ball bonding or wedge bonding, can be made. Although shown as rectangular in shape, the wire-bond pad 9 can be arranged in other configurations, as well. For example, the dimensions of the wire-bond pad 9 can be adjusted to accommodate multiple wire-bond connections.

The landing pad 7 should be formed from a thermally conductive material that serves to transfer heat away from the optoelectronic device. In some cases, the landing pad 7 also can be electrically conducting such that an electrical connection can be made between the pad and the device. The wire-bond pad 9 should be formed from an electrically conductive material. However, in some implementations, the wire-bond pad 9 also is thermally conductive. As an example, both the landing pad 7 and wire-bond pad 9 are formed from a metal, such as gold (Au) or copper (Cu). In other implementations, multiple layers of metal can be used to form the landing pad 7 and wire-bond pad 9.

In the present example, the submount 1 is formed from a semiconductor substrate, such as silicon. Alternatively, the submount 1 can be formed from an insulating material such as glass or silicon oxide, or a composite material, such as silicon-on-insulator. Other substrate materials may be used as well.

As shown in the example of FIG. 1A, openings 11, 12 are located in two of the four vertical substrate sidewalls 4 and are formed by removing portions of the submount 1. A first recess 11 is formed at a far end of the submount 1 and adjacent to the landing pad 7. A second recess 12 is formed at an opposite near end of the submount 1, adjacent to the wire-bond pad 9.

Each recess 11, 12 includes a u-shaped notch 14 in the horizontal plane of the top surface 5, in which the notch is enclosed on three sides by the substrate. Additionally, each recess 11, 12 is defined by three slanted recess walls 6, 8 and 10. Each of the recess walls in a recess slants away from the corresponding notch 14 towards the substrate bottom surface 19. In the implementation shown in FIGS. 1B and 2, the recess walls 6, 8, 10 are trapezoidal in shape. That is to say, the width of each recess wall is narrower at the intersection with the assembly side 5 than it is at the intersection with the contact side 19. Accordingly, the size of each recess 11, 12 (as defined by the recess walls 6, 8, 10) is smaller on the assembly side 5 and larger on the contact side 19. Additional implementations can include openings having alternative configurations.

Figure 1B:
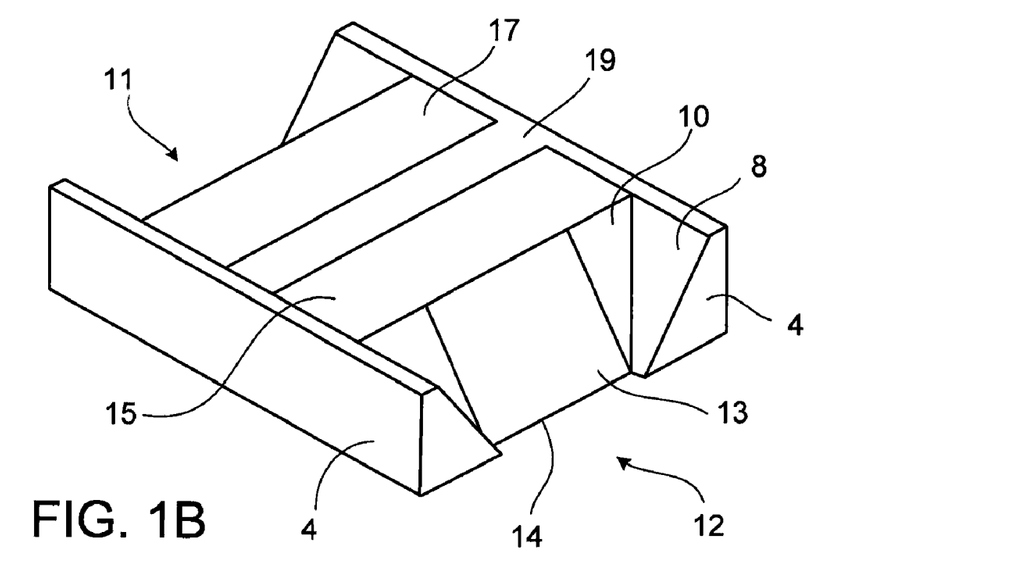
FIG. 1B illustrates another view of the submount of FIG. 1A.
Figure 2:
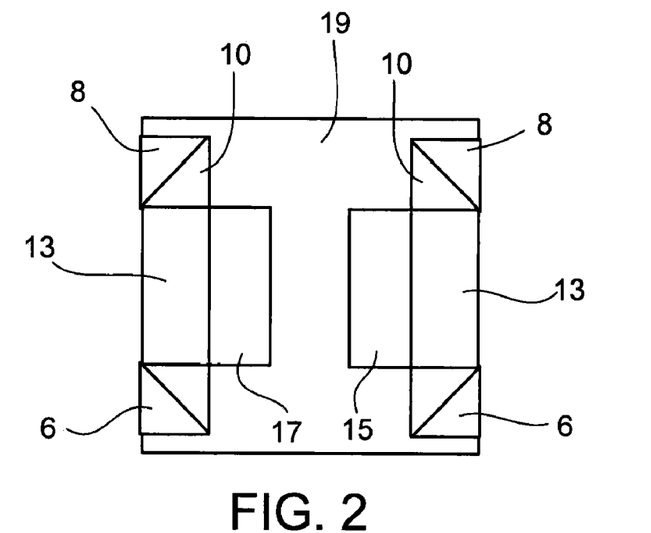
FIG. 2 is a bottom view of the submount of FIG. 1A.

As shown in FIGS. 1B and 2, the contact side 19 of the submount includes a thermal contact pad 17. The contact side also includes a separate surface mount device (SMD) pad 15 that is electrically and thermally isolated from the thermal contact pad 17. The thermal contact pad 17 is formed from a thermally conductive material that transfers heat away from both the submount 1 and the optoelectronic device mounted on the assembly side 5. The thermal contact pad 17 also can be electrically conductive. The SMD pad 15 is formed from an electrically conductive material to provide an electrical connection from the wire-bond pad 9 to external devices (not shown) such as a printed circuit board using surface mount technology. In some implementations, the SMD pad 15 also serves to transfer heat away from the submount 1. As an example, the thermal contact pad 17 and SMD 15 are both formed of a metal, such as Au or Cu.

Figure 3B:
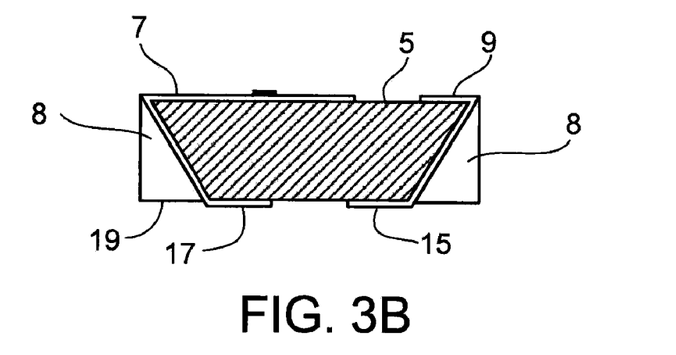
FIG. 3B is a sectional view taken along the lines I-I in FIG. 3A.

The wire-bond pad 9 on the assembly side 5 is electrically and thermally connected to the SMD pad 15 on the contact side 19 by means of a wrap-around contact 13A formed on recess wall 10 in the recess 12. Similarly, the landing pad 7 on the assembly side 5 is thermally and electrically connected to the thermal contact pad 17 by means of a wrap-around contact 13B formed on the recess wall 10 in the recess 11 (see FIG. 2). As illustrated in the example of FIGS. 1A, 1B and 3B, each of the wrap-around contacts 13A, 13B extends continuously along the corresponding recess wall 10 between the wire-bond pad 9 on the submount top surface to the SMD pad 15 on the submount bottom surface. The wrap-around contact 13A in recess 12 that connects landing pad 7 to thermal contact pad 17 is substantially similar to the wrap-around contact 13B in recess 11. The wrap-around contacts 13A, 13B can be formed from the same material as the assembly side and contact side pads including, for example, metals such as Au and Cu. In some implementations, the wrap-around contacts 13 have multiple layers.

FIGS. 4A, 4B, 5, 6A and 6B show another example of a submount 21 for an optoelectronic device having a top surface 25 and a bottom surface 39. The top surface 25 is formed in a horizontal plane and is substantially parallel to the bottom surface 39. The top and bottom surfaces 25, 39 intersect with four vertical sidewalls 24 in a single integral device, in which the sidewalls 24 have no notches as in the implementation of FIG. 1.

Figure 4A:
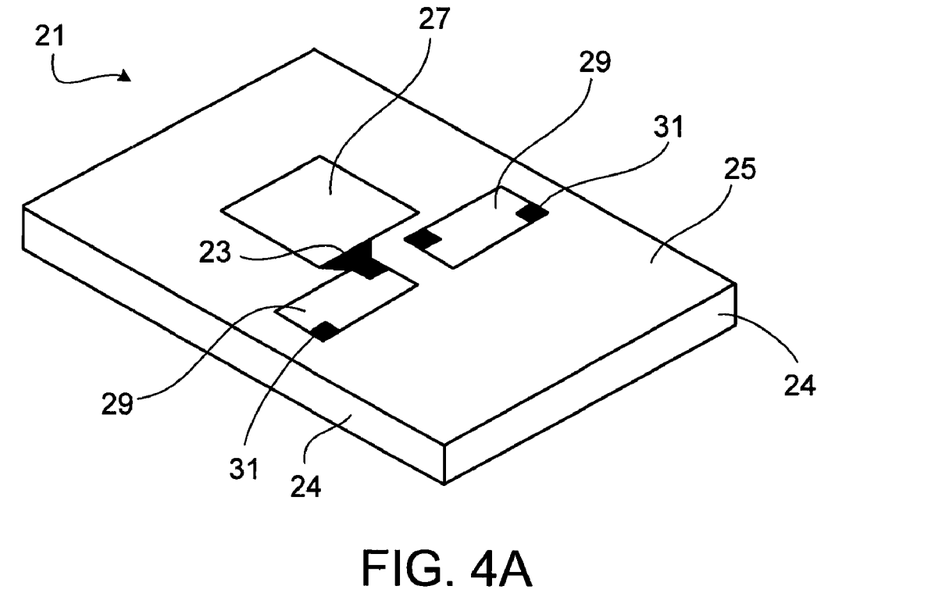
FIG. 4A illustrates another example of a submount for an optoelectronic device.
Figure 6A:
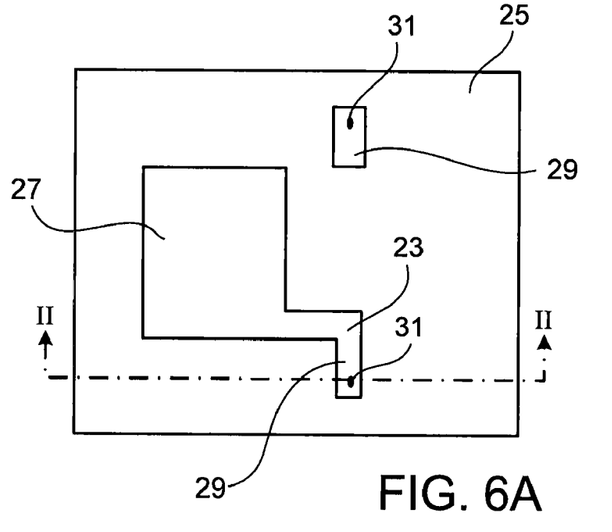
FIG. 6A is a top view of the submount of FIG. 4A.

As illustrated in the example of FIGS. 4A and 6A, the top surface, or assembly side 25, includes a device mounting pad 27 for the optoelectronic device and one or more wire-bond pads 29 for bonding wires that electrically connect to the device. The pads 27, 29 are formed from thermally and/or electrically conductive material such as metal. In some implementations, the pads 27, 29 are formed having multiple layers.

Figure 4B:
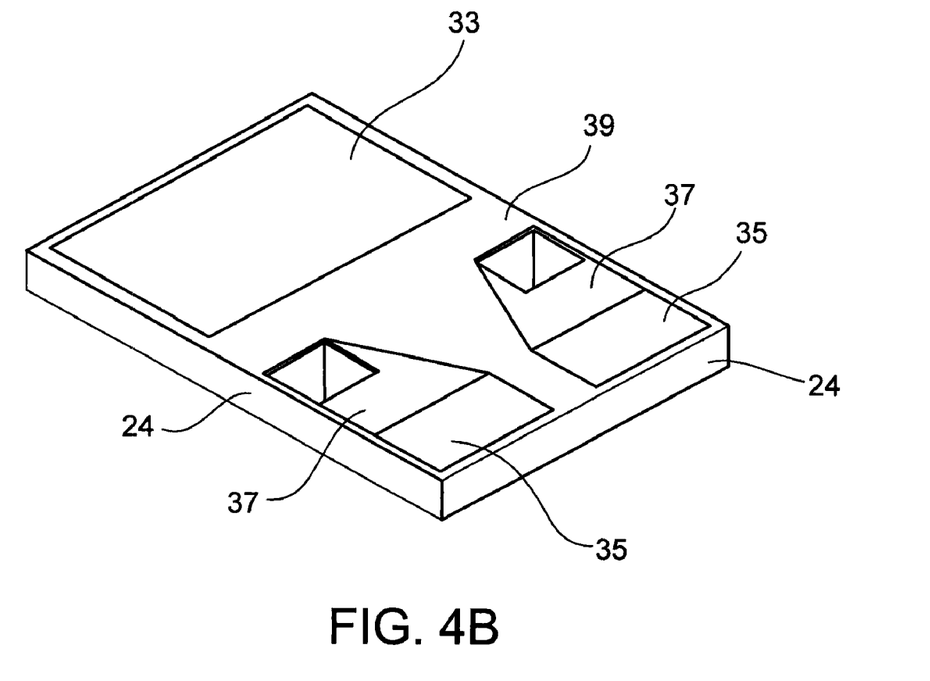
FIG. 4B illustrates another view of the submount of FIG. 4A.
Figure 5:
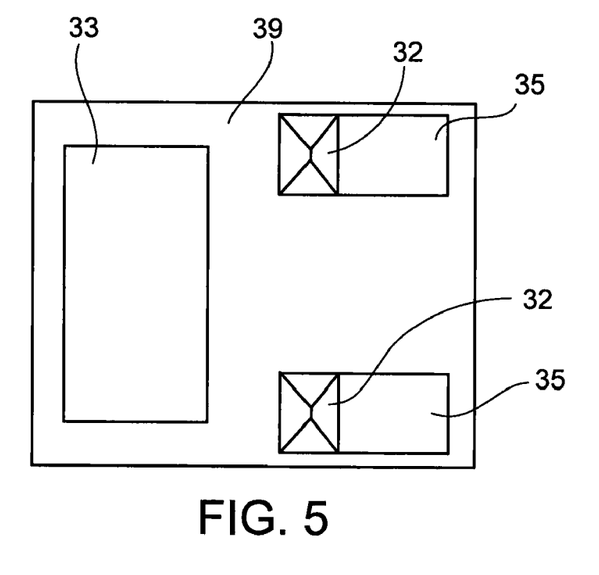
FIG. 5 is a bottom view of the submount of FIG. 4A.

The bottom surface 39 of the submount 21 is the contact side on which one or more electrical and/or thermal connections can be made to external components and devices. As shown in FIGS. 4B and 5, the bottom surface 39 includes a thermal contact pad 33 and one or more SMD pads 35 which are electrically and thermally isolated from the thermal contact pad 33. The pads 33, 35 are formed from thermally and/or electrically conductive material such as metal. In some implementations, the pads 33, 35 are formed having multiple layers.

The submount 21 is formed from a semiconductor substrate, such as silicon. Alternatively, the submount 21 may be formed from an insulating material such as glass or silicon oxide, or a composite material, such as silicon-on-insulator. Other substrate materials may be used as well.

Figure 6B:
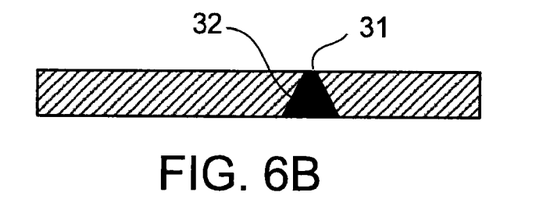
FIG. 6B is a sectional view taken along the lines II-II in FIG. 6A.

As illustrated in FIGS. 4A, 4B and 6B, the submount 21 includes feedthrough metallization 31 that extends from the assembly side 25 through the substrate to the contact side 39. In some cases, the openings for the feedthrough metallization 31 are formed by anisotropically etching the substrate from the contact side 39 to the assembly side 25. Accordingly, the size of the openings on the contact side 39 can be larger than the size of the openings on the assembly side 25.

The feedthrough metallization 31 is located adjacent the wire-bond pads 29 on the assembly side 25 and adjacent solder dams 37 on the contact side. Side-walls of the openings for the feedthrough metallization 31 are coated with one or more layers of conductive material to form feedthrough contacts 32. The feedthrough contacts 32 are electrically and/or thermally coupled to both the wire-bond pads 29 on the assembly side 25 and to the solder dams 37 on the contact side 39. The feedthrough contacts 32 can include vapor deposited metals, such as Au or Cu. In some implementations, the feedthrough contact 32 does not fill the entire opening such that an unobstructed passage remains between the assembly side 25 and the contact side 39. In other implementations, the openings are entirely filled with the feedthrough contacts 32 such that the openings are sealed. The feedthrough contact material may be provided, for example, using an electroplated feed-through metallization process.

In some cases, the device mounting pad 27 is electrically connected to one or more of the wire-bond pads 29 through a planar metal layer 23 formed on the top surface of submount 21. The planar metal layer can be formed from the same material as the device mounting pad 27 and the wire-bond pads 29. As a result, the device mounting pad 27 can be thermally connected to the SMD pad 35 on the bottom surface of the submount 21. In addition, the planar metal layer 23 can provide an electrical connection between the device mounting pad 27 and the SMD pad 35, such that a wire-bond is not required.

The solder dams 37 on the contact side 39 of the submount 21 can include one or more layers of a vapor deposited metal, such as titanium (Ti) and serve to prevent solder applied to the SMD pads 35 from contacting or entering the openings for the feedthrough metallization 31. The solder dams 37 are positioned between the openings for the feedthrough metallization 31 and the SMD pads 35 and are electrically and/or thermally coupled to the SMD pads 35 and to the feedthrough contacts 32.

Figure 7:
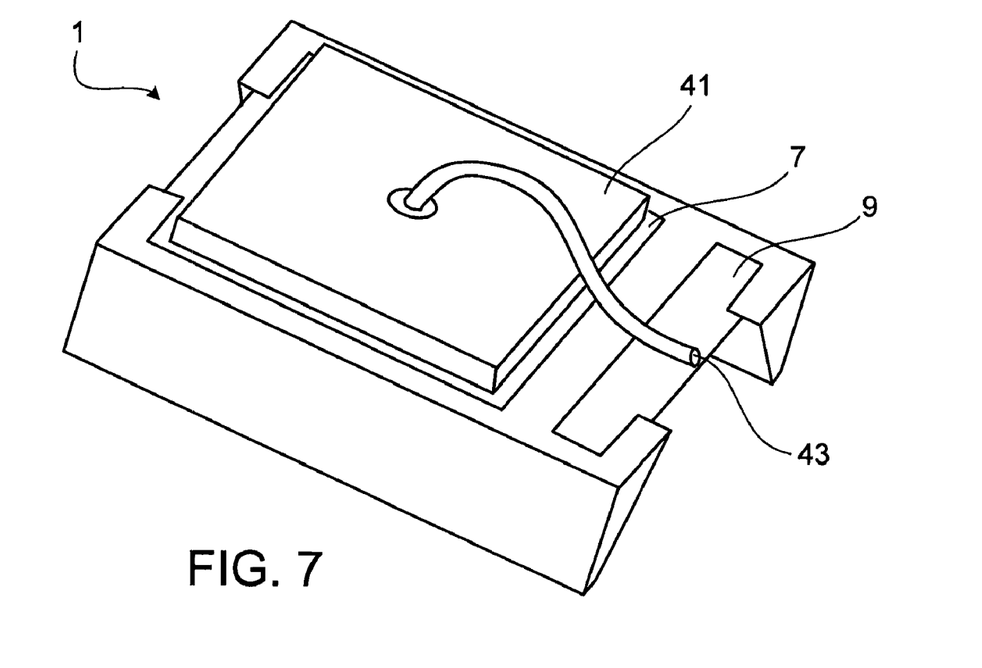
FIG. 7 shows an example of an optoelectronic device fixed to a submount.

FIG. 7 shows an example of an optoelectronic device 41, such as a LED, that is mounted on the landing pad 7 of submount 1. Submount 21 (FIG. 4A) can be used in place of submount 1. The device 41 is mounted using microfabrication techniques such as solder bonding. An example of solder bonding includes using gold-tin (AuSn) bonding. Alternatively, the device 41 can be fixed to the landing pad 7 by means of an epoxy or resin. The epoxy or resin can be thermally conductive. The device 41 is electrically connected to the wire-bond pad 9 by means of a wire 43. In some cases, the device 41 can be mounted to the landing pad 7 by means of flip-chip bonding, such that the device is electrically connected to the landing pad 7.

Accordingly, as shown in the examples of FIGS. 1-7, a generic device submount that has a standard SMD connection can be constructed for use regardless of the particular layout, configuration, contacts, and wiring technology of the optoelectronic device that is fixed to the submount. In addition, the foregoing designs require minimal use of submount space. As a result, the overall optoelectronic package size is reduced such that a higher density of devices can be assembled together. This can enable, for example, LED displays having higher resolutions. In another example, lighting displays can be made smaller but have throughput comparable to a larger display.

Figure 8:
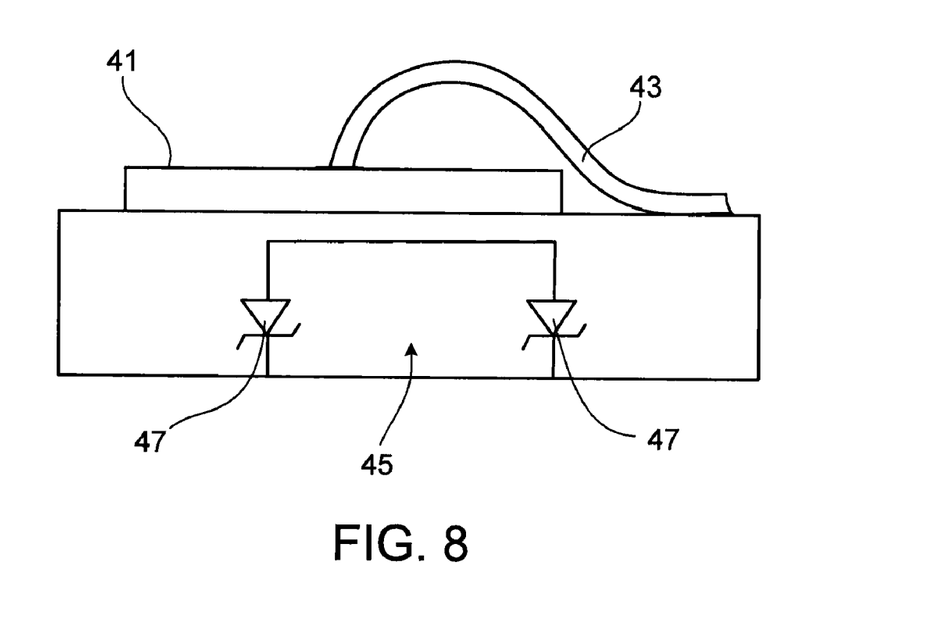
FIG. 8 shows an example of a submount that includes circuitry formed within the submount.

In some implementations, passive or active circuitry can be incorporated internally into the submount. FIG. 8 shows an example of an optoelectronic device 41, such as a LED, fixed to a submount 1 in which electrostatic discharge (ESD) protection circuitry 45 is formed in the submount semiconductor substrate. Submount 21 (FIG. 4A) may be used in place of submount 1. The protection circuitry 45 includes two zener diodes 47 configured back-to-back and can be formed, for example, by applying a phosphorous and boron diffusion process to the semiconductor substrate. When excess electrical charge creates a voltage across the LED that exceeds a threshold voltage, the protection circuitry 45 clamps the voltage and diverts excess current to protect the LED. In some cases, only a single zener diode is necessary to protect the device 41. Other passive and active circuit components can be incorporated into the submount as well, using fabrication techniques such as complimentary metal oxide semiconductor (CMOS) processing.

In some implementations, the passive or active circuit components can be formed externally on the surface of the submount. For example, passive resistor, capacitor or inductor components can be formed on the submount top surface using standard microfabrication techniques. Alternatively, or in addition, active circuit components, such as IC chips can be mounted to external surfaces of the submount.

Figure 9:
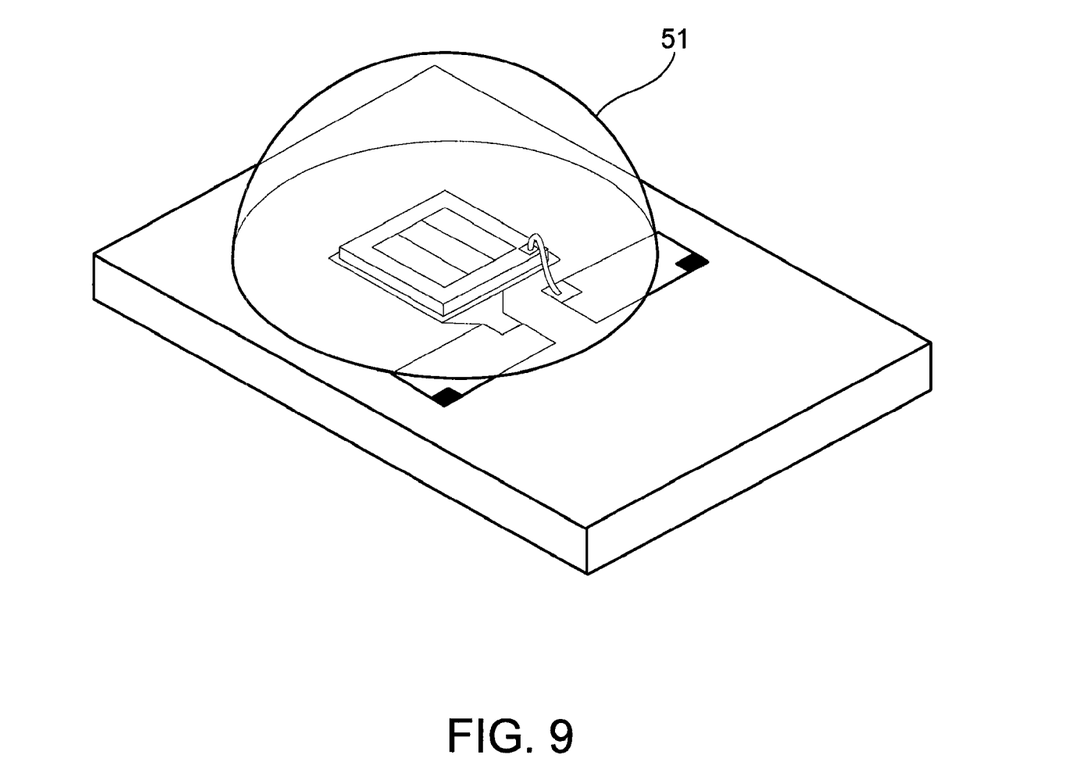
FIG. 9 shows an example of a cover fixed to a submount.

In some implementations, it is desirable to cover the optoelectronic device 41 for protection or to manipulate light emitted or received in the device. As an example, FIG. 9 shows a cover 51 formed over a LED 41 in which the LED is fixed to submount 21. Submount 1 (FIG. 1A) can be used in place of submount 21. The cover 51 protects the LED 41 from damage. In some cases, the cover 51 is a lens prepared from a mold, in which the shape of the lens focuses light emitted from the device 41. As a result, the molded lens 51 can provide an increase in light output from the optoelectronic device or focus light onto the device 41. The cover 51 can be formed from any material that is transparent to light emitted from, or is to be received by, the optoelectronic device 41. For example, the cover 51 can be fabricated from polymer materials, including, for example, silicones or from glass. The cover 51 is fixed to the surface using bonding material such as epoxy or resin. In some cases, the adhesiveness of the polymer that forms the cover is sufficient to fix the cover 51 to the submount surface.

Figure 10A:
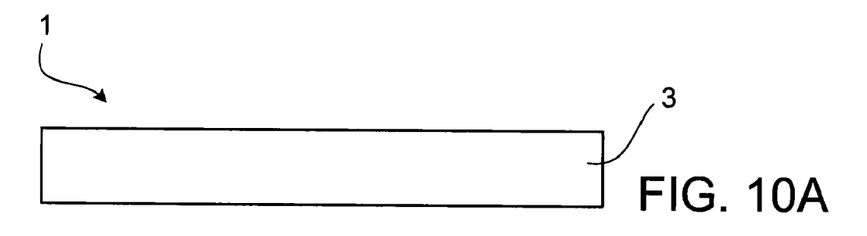
FIGS. 10A-10E illustrate a first process of fabricating a submount.
Figure 10B:
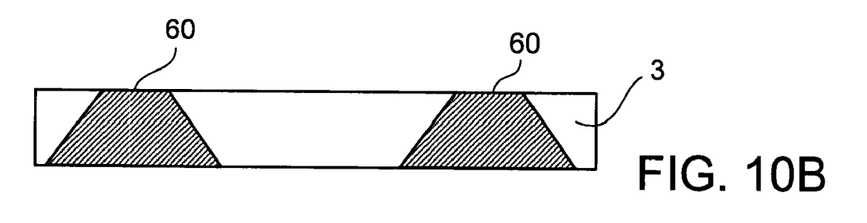

FIGS. 10A-10E are sectional views illustrating an example process of fabricating the submount 1 depicted in FIG. 1. As shown in FIGS. 10A-10B, cavities 60 are etched into the substrate 3. The cavity etch progresses from the substrate bottom surface completely through the substrate thickness to the substrate top surface, thereby forming sloped cavity sidewalls. The cavities 60 can be formed using known wet etching techniques. However, other etching techniques, such as dry etching or laser drilling, may be used as well.

Figure 10C:
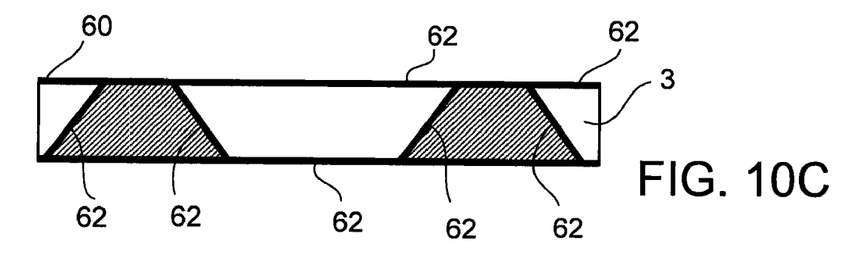

After performing the cavity etch, the surfaces of the substrate 3 and cavities 60 are coated with a metal layer 62 (see FIG. 10C). The metal layer 62 is formed using metal deposition techniques such as electron beam deposition, thermal vapor deposition or sputtering. Other metal deposition techniques can be used as well. The metal layer 62 can include multiple layers of different metals such as gold, titanium and chromium.

Figure 10D:
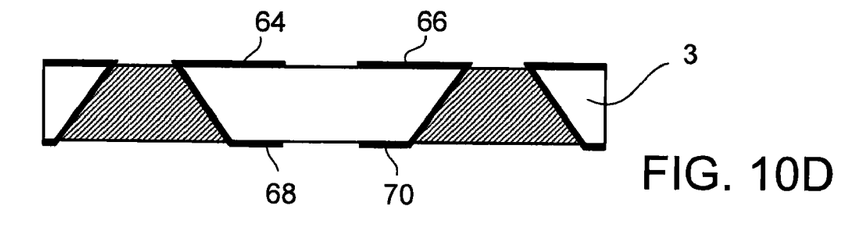

As shown in FIG. 10D, the metal layer 62 then is patterned and etched such that a landing pad 64/wire-bond pad 66 pair is formed on the substrate top surface and a thermal contact pad 68/SMD pad 70 pair is formed on the substrate bottom surface. The metal pattering step electrically isolates landing pad 64 and thermal contact pad 68 from wire-bond pad 66 and SMD pad 70, respectively. However, electrical connectivity is maintained between the landing pad 64 and contact pad 68 and between wire-bond pad 66 and SMD pad 70. In addition, the metal layer 62 can be further patterned to form solder dams on the substrate top and bottom surface (see FIG. 1B).

Figure 10E:
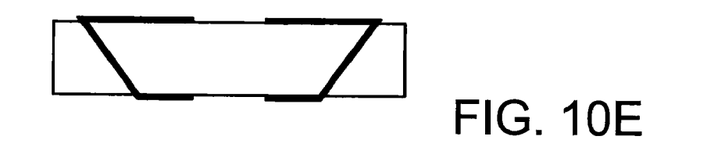
Figure 11A:
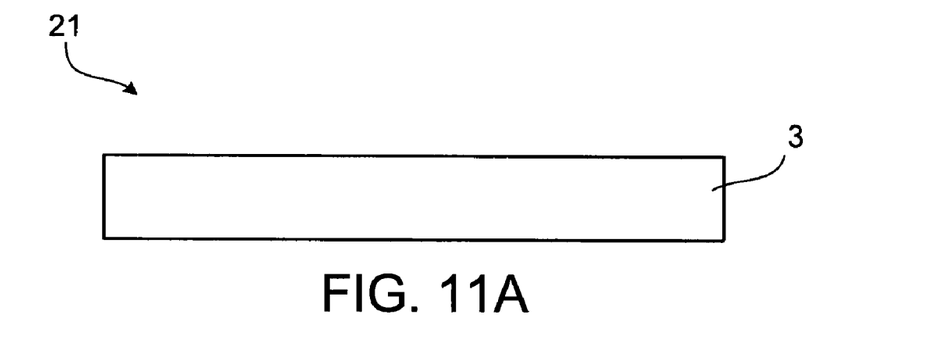
FIGS. 11A-11D illustrate a second process of fabricating a submount.
Figure 11B:
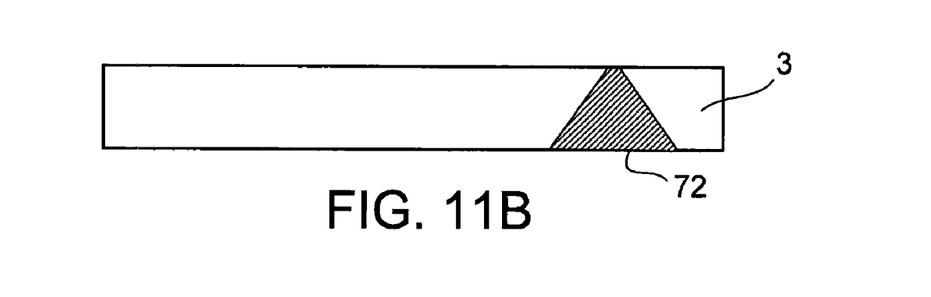
Figure 11C:
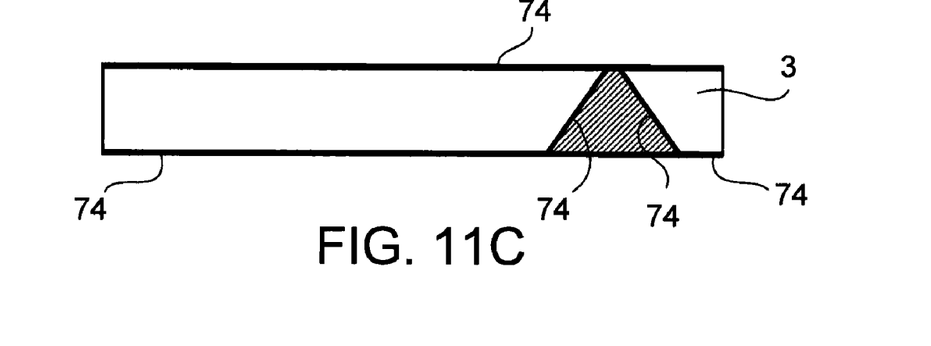
Figure 11D:
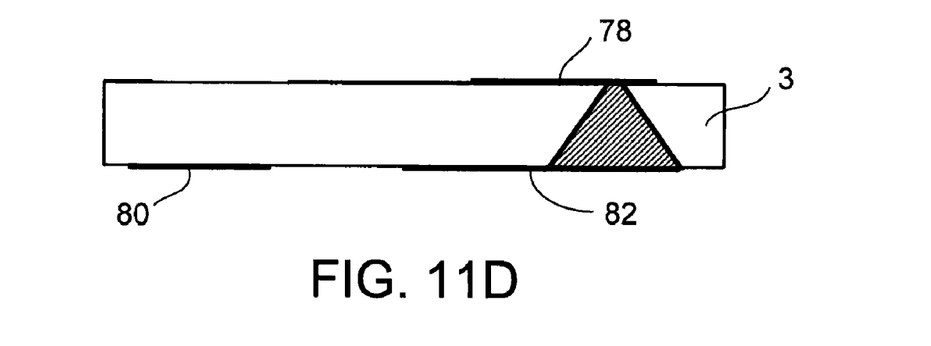
Figure 12A:
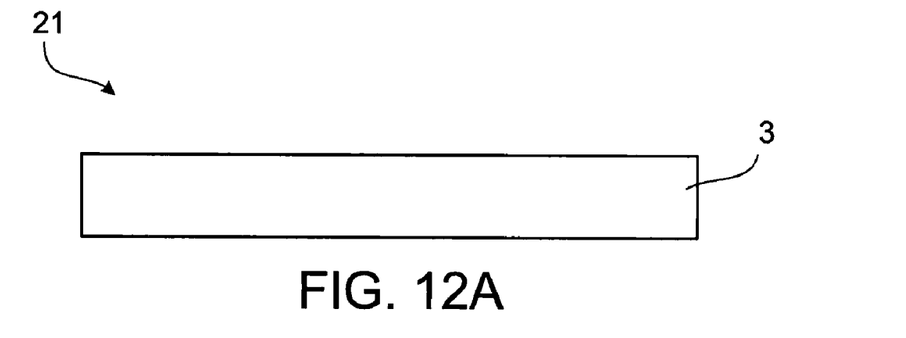
FIGS. 12A-12D illustrate a third process of fabricating a submount.
Figure 12B:
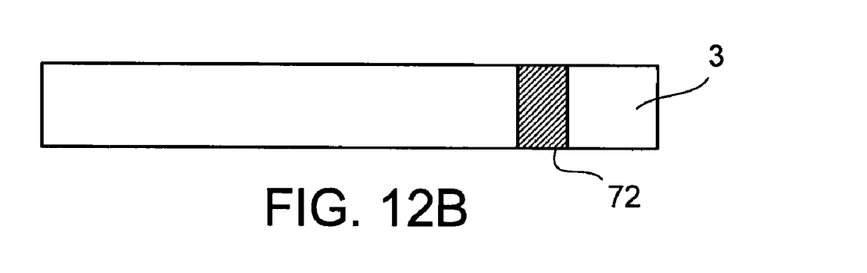
Figure 12C:
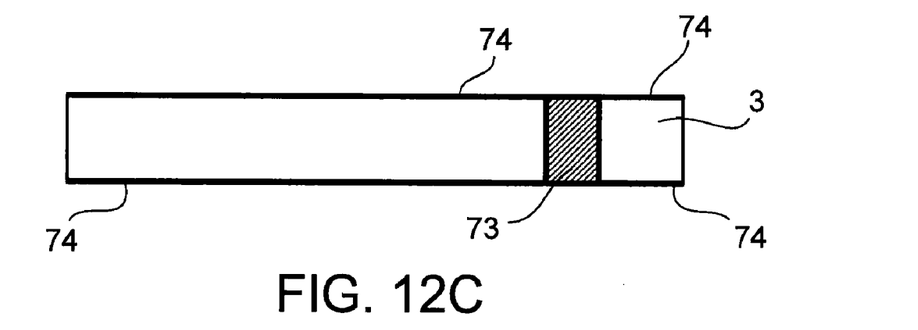
Figure 12D:
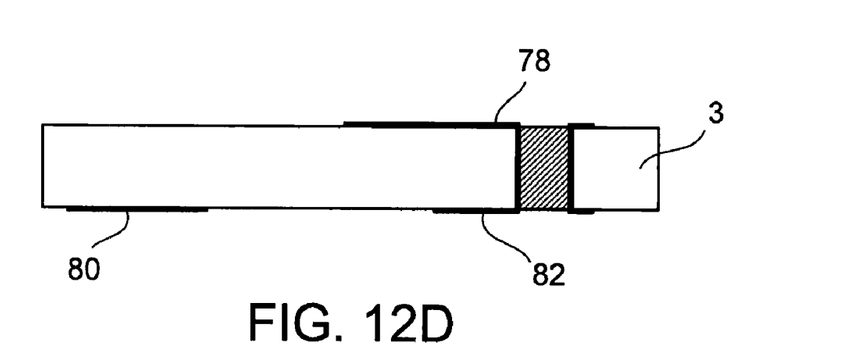

Following the patterning step, the substrate 3 is diced to form individual submounts 1 (see FIG. 10E). As shown in FIG. 10E, the dicing is performed on either side of the landing pad/wire-bond pad pair. Additionally, the dicing bisects both the cavity formed adjacent to the landing pad 64 and the cavity adjacent to wire-bond pad 66. As a result of the dicing, the remaining portion of the substrate cavities each resemble a recess formed in the submount sidewalls.

FIGS. 11A-11D are sectional views illustrating another example process of fabricating the submount 21 depicted in FIG. 4. As shown in FIGS. 10A-11B, cavities 72 are etched into the substrate 3. The etch progresses from the substrate bottom surface completely through the substrate thickness to the substrate top surface, while forming sloped cavity sidewalls. The etch can be performed using, for example, wet etch techniques known in the semiconductor processing industry. Subsequently, the top and bottom substrate surfaces and the cavity sidewalls are coated with a metal layer 74 using a standard metal deposition technique as explained above (see FIG. 11C). Optionally, the cavities 72 can be filled with metal so that no opening exists in the substrate 3 between the top and bottom surface. The cavities may be filled with metal by means of electro-less or electrochemical deposition methods. The metal layer 74 then is patterned to form a landing pad (not shown), one or more wire-bond pads 78, a thermal contact pad 80 and one or more SMD pads 82. The landing pad can be electrically isolated from all or some of the wire-bond pads 78 formed on the substrate surface. The thermal contact pad 80 is electrically isolated from the SMD pad 82 formed on the substrate bottom surface. Following the metal patterning, the substrate 3 is diced into individual submounts 21, each of which includes a singe landing pad and one or more wire-bond pads 78.

FIGS. 12A-12D illustrate, in another implementation, sectional views of a third process for fabricating the submount 21 in which the cavities 72 are formed by drilling through the substrate 3 instead of etching. For example, laser drilling may be used to form cylindrical cavities 72 in which metal is later deposited. The cavities can be filled with metal 73 so that no opening exists between the top and bottom surfaces of the substrate 3. Alternatively, the cavity sidewalls can be covered with a thin layer of metal such that an opening extends through the substrate cavity 72.

A number of implementations of the invention have been described. Nevertheless, it will be understood that various modifications may be made without departing from the spirit and scope of the invention. Other implementations are within the scope of the following claims.

What is claimed is:

1. A submount for an optoelectronic device comprising:
   a silicon substrate;
   a first top pad on a top surface of the substrate;
   a first bottom pad on a bottom surface of the substrate; and
   a first wrap-around contact in a recess of a first exterior sidewall of the substrate, wherein the first wrap-around contact is coupled electrically to the first top pad and to the first bottom pad,
   wherein the recess in the first exterior sidewall is defined at least in part by a sidewall slanted with respect to a plane that is perpendicular to the top and bottom surfaces of the substrate.

2. A submount for an optoelectronic device comprising:
   a silicon substrate;
   a first top pad on a top surface of the substrate;
   a first bottom pad on a bottom surface of the substrate;
   a first wrap-around contact in a recess of a first exterior sidewall of the substrate, wherein the first wrap-around contact is coupled electrically to the first top pad and to the first bottom pad;
   a second top pad on the top surface of the substrate;
   a second bottom pad on the bottom surface of the substrate; and
   a second wrap-around contact in a recess of a second exterior sidewall of the substrate, wherein the second wrap-around contact is coupled electrically to the second top pad and to the second bottom pad,
   wherein each of the recess in the first exterior sidewall and the recess in the second exterior sidewall is defined at least in part by a respective sidewall slanted with respect to a plane that is perpendicular to the top and bottom surfaces of the substrate.

3. The submount of claim 2 wherein the first wrap-around contact is on the slanted sidewall of the first recess and the second wrap-around contact is on the slanted sidewall of the second recess.

4. The submount of claim 3 wherein the first top pad is a device mounting pad and the second top pad is a wire-bond pad.

5. The submount of claim 4 further comprising an optoelectronic device mounted to the device mounting pad.

6. The submount of claim 5 further comprising a wire-bond electrically connecting the optoelectronic device to the wire-bond pad.

7. The submount of claim 5 wherein the optoelectronic device is a LED.

8. The submount of claim 3 wherein the first bottom pad is a SMD contact pad.

9. The submount of claim 3 wherein the first bottom pad is a SMD contact pad and the second bottom pad is a thermally conductive contact pad.

10. The submount of claim 3 further comprising passive or active circuit components within the substrate.

11. The submount of claim 10 wherein the passive or active circuit components comprise electrostatic discharge protection circuitry.

12. The submount of claim 3 further comprising a cover for the optoelectronic device.

13. The submount of claim 12 wherein the cover is a lens.

14. The submount of claim 13 wherein the lens comprises a polymer.

15. The submount of claim 3 wherein the first top pad is a device mounting pad and the second top pad is a wire-bond pad, and wherein each slanted sidewall is narrower near the top surface of the substrate than near the bottom surface of the substrate.

16. The submount of claim 15 wherein the first bottom pad is a SMD contact pad and the second bottom pad is a thermally conductive contact pad.

17. A submount for an optoelectronic device comprising:
a silicon substrate;
a device mounting pad on a top surface of the substrate;
a wire-bond pad on the top surface of the substrate;
a contact pad on the bottom surface of the substrate; and
a feedthrough contact extending through the substrate and electrically coupling the wire-bond pad to the contact pad, wherein the feedthrough contact is on a sidewall of a feedthrough opening such that an unobstructed passageway extends from the top surface through the substrate to the bottom surface.

18. The submount of claim 17 further comprising a thermally conducting pad on the bottom surface of the substrate.

19. The submount of claim 17 further comprising:
a plurality of wire-bond pads on the top surface of the substrate;
a plurality of contact pads on the bottom surface of the substrate; and
a plurality of feedthrough contacts extending through the substrate, wherein each feedthrough contact electrically couples one of the plurality of wire-bond pads to one of the plurality of contact pads, wherein each feedthrough contact is on a sidewall of a respective feedthrough opening such that an unobstructed passageway extends from the top surface through the substrate to the bottom surface.

20. The submount of claim 17 further comprising a solder dam on the bottom surface of the substrate, wherein the solder dam couples the feedthrough contact to the contact pad.

21. The submount of claim 17 wherein the contact pad is a SMD pad.

22. The submount of claim 17 further comprising an optoelectronic device mounted to the device mounting pad.

23. The submount of claim 22 further comprising a wire-bond electrically connecting the optoelectronic device to the wire-bond pad.

24. The submount of claim 22 wherein the optoelectronic device is a LED.

25. The submount of claim 17 further comprising a planar metal layer on the substrate top surface, wherein the planar metal layer electrically couples the device mounting pad to the wire-bond pad.

26. The submount of claim 17 further comprising passive or active circuit components within the substrate.

27. The submount of claim 26 wherein the circuit components comprise electrostatic discharge protection circuitry.

28. The submount of claim 17 further comprising a cover for the optoelectronic device.

29. The submount of claim 28 wherein the cover is a lens.

30. The submount of claim 29 wherein the lens comprises a polymer.

31. A method of fabricating an optoelectronic submount comprising:
forming a plurality of cavities in a silicon substrate, wherein each opening in a cavity extends from a bottom surface of the substrate to a top surface of the substrate;
depositing a metal layer on a top and bottom surface of the substrate and on a sidewall of each cavity and sealing the cavity openings with metal;
patterning the metal layer to form a landing pad and wire-bond pad on the substrate top surface and a contact pad and a SMD pad on the substrate bottom surface, wherein the metal layer on a first cavity sidewall electrically couples the landing pad to the contact pad and wherein the metal layer on a second cavity sidewall electrically couples the wire-bond pad to the SMD pad; and
dicing the substrate through a pair of the cavities to form the submount with a first wrap-around contact in a recess of a first exterior sidewall and a second wrap-around contact in a recess of a second exterior sidewall.

32. The method of forming an optoelectronic submount according to claim 31 further comprising mounting an optoelectronic component to the landing pad.

33. The method of forming an optoelectronic submount according to claim 32 further comprising electrically connecting the optoelectronic component to the wire-bond pad.

34. The method of forming an optoelectronic submount according to claim 32 further comprising forming electrostatic discharge protection circuitry within the substrate and electrically coupling the protection circuitry to the optoelectronic component.

35. The method of forming an optoelectronic submount according to claim 31 further comprising attaching a cover on the substrate to seal the optoelectronic component.

36. A submount for an optoelectronic device comprising:
a silicon substrate;
a device mounting pad on a top surface of the substrate;
a wire-bond pad on the top surface of the substrate;
a contact pad on the bottom surface of the substrate;
a feedthrough contact extending through the substrate and electrically coupling the wire-bond pad to the contact pad; and
a solder dam on the bottom surface of the substrate, wherein the solder dam couples the feedthrough contact to the contact pad.

37. The submount of claim 36 wherein the contact pad is a SMD pad.

* * * * *